US010606111B2

(12) United States Patent
Gao et al.

(10) Patent No.: US 10,606,111 B2
(45) Date of Patent: Mar. 31, 2020

(54) DISPLAY DEVICE, DISPLAY METHOD THEREOF, NEAR-TO-EYE DISPLAY DEVICE, AND DISPLAY METHOD THEREOF

(71) Applicant: BOE TECHNOLOGY GROUP CO., LTD., Beijing (CN)

(72) Inventors: Jian Gao, Beijing (CN); Xiaochuan Chen, Beijing (CN); Yafeng Yang, Beijing (CN); Wei Wang, Beijing (CN); Jifeng Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/752,333

(22) PCT Filed: Aug. 3, 2017

(86) PCT No.: PCT/CN2017/095831
§ 371 (c)(1),
(2) Date: Feb. 13, 2018

(87) PCT Pub. No.: WO2018/076878
PCT Pub. Date: May 3, 2018

(65) Prior Publication Data
US 2019/0339552 A1  Nov. 7, 2019

(30) Foreign Application Priority Data

Oct. 31, 2016  (CN) .......................... 2016 1 0931762

(51) Int. Cl.
*G02F 1/1335* (2006.01)
*G02F 1/1343* (2006.01)
*H01L 27/32* (2006.01)

(52) U.S. Cl.
CPC .......... *G02F 1/1335* (2013.01); *G02F 1/1343* (2013.01); *H01L 27/3232* (2013.01);
(Continued)

(58) Field of Classification Search
CPC ... G02F 1/1335; G02F 1/1343; H01L 27/3232
See application file for complete search history.

(56) References Cited

U.S. PATENT DOCUMENTS

2004/0263968 A1* 12/2004 Kobayashi ......... G02B 27/2235
  359/462
2017/0055825 A1  3/2017 Tumlinson
2017/0059869 A1  3/2017 Lee

FOREIGN PATENT DOCUMENTS

CN  205281069 U  6/2016
CN  106019605 A  10/2016
(Continued)

OTHER PUBLICATIONS

International Search Report and Written Opinion for Application No. PCT/CN2017/095831, dated Nov. 3, 2017, 10 Pages.
(Continued)

*Primary Examiner* — Lucy P Chien
(74) *Attorney, Agent, or Firm* — Brooks Kushman P.C.

(57) ABSTRACT

A display device and a display method thereof are provided. The display device includes a display panel and at least one optical device arranged at a light-exiting side of the display panel. A light beam emitted from the display panel is a linearly-polarized, collimated light beam. The optical device includes a plurality of optical units independent of each other and corresponding to pixel units of the display panel in a one-to-one correspondence manner. Each optical unit is capable of refracting the light beam emitted from the display panel at an adjustable angle. Collimated light beams from the adjacent optical units have different emergent angles so that the light beams emitted from the display panel are converged at two viewing points, so as to display a virtual image with a spatial depth.

13 Claims, 7 Drawing Sheets

(52) U.S. Cl.
CPC ............ *G02F 2001/133562* (2013.01); *G02F 2201/16* (2013.01); *G02F 2203/07* (2013.01)

(56) References Cited

FOREIGN PATENT DOCUMENTS

| CN | 106444060 A | 2/2017 |
| CN | 206115088 U | 4/2017 |
| WO | 2015162098 A1 | 10/2015 |
| WO | 2015174794 A1 | 11/2015 |

OTHER PUBLICATIONS

First Office Action for Chinese Application No. 201610931762.2, dated Feb. 5, 2018, 6 Pages.

\* cited by examiner

DISPLAY DEVICE, DISPLAY METHOD THEREOF, NEAR-TO-EYE DISPLAY DEVICE, AND DISPLAY METHOD THEREOF

CROSS-REFERENCE TO RELATED APPLICATION APPLICATIONS

This application is the U.S. national phase of PCT Application No. PCT/CN2017/095831 filed on Aug. 3, 2017, which claims priority to Chinese Patent Application No. 201610931762.2 filed on Oct. 31, 2016, which are incorporated herein by reference in their entireties.

TECHNICAL FIELD

The present disclosure relates to the field of display technology, in particular to a display device, a display method thereof, a near-to-eye display device, and a display method thereof.

BACKGROUND

For a virtual display device, two positive lenses are arranged in front of a display panel in such a manner that a focal length of each positive lens is greater than a distance between the display panel and the positive lens. In this way, the positive lens functions as a magnifying lens capable of magnifying an image and enabling the image farther from a human eye. Hence, erected virtual images acquired at a near-to-eye position through the positive lenses may be combined in a brain, so as to produce a stereo image.

The conventional virtual display device has the following drawbacks. The two positive lenses are relatively thick and heavy. In addition, an optical aberration may occur due to the single lens, and thereby a feeling of discomfort may occur when the virtual display device is worn by a person or the image is displayed on the virtual display device. Further, the virtual image displayed by the virtual display device has a fixed spatial depth.

SUMMARY

An object of the present disclosure is to provide a display device, a display method thereof, a near-to-eye display device, and a display method thereof, so as to display a virtual image with any spatial depth.

In one aspect, the present disclosure provides in some embodiments a display device, including: a display panel, configured to emit a light beam being linearly-polarized, collimated; and at least one optical device arranged at a light-exiting side of the display panel. The optical device includes a plurality of optical units independent of each other and corresponding to pixel units of the display panel in a one-to-one correspondence manner. Each optical unit is capable of refracting the light beam emitted from the display panel at an adjustable angle. Collimated light beams from the adjacent optical units have different emergent angles so that the light beams emitted from the display panel are converged at two viewing points, so as to display a virtual image with a spatial depth.

In a possible embodiment of the present disclosure, the optical device includes: a first electrode and a second electrode arranged opposite to each other; and a liquid crystal cell arranged between the first electrode and the second electrode. The liquid crystal cell includes a plurality of liquid crystal units independent of each other. The first electrode and the second electrode are arranged on different transparent substrates respectively, or on a same transparent substrate. The first electrode and the second electrode are powered to generate an electric field so as to drive liquid crystal molecules in each liquid crystal unit to be deflected. Each liquid crystal unit and the first electrode and second electrode that correspond to the liquid crystal unit form the optical unit, and after the liquid crystal molecules in each optical unit are driven to be deflected by the electric field, the optical unit is equivalent to a right angle prism.

In a possible embodiment of the present disclosure, the display device further includes a processing circuit and a driving circuit. The processing circuit is configured to acquire the spatial depth of the virtual image to be displayed by the display device, determine an inclination angle of the equivalent right angle prism corresponding to each optical unit based on the spatial depth of the virtual image, divide each optical unit into m portions, and determine a difference between a refractive index of each portion of the optical unit and a refractive index of a portion with a minimum refractive index based on the inclination angle of the equivalent right angle prism corresponding to the optical unit, where m is an integer greater than 1. The driving circuit is configured to drive the liquid crystal molecules in each portion of the optical unit to be deflected based on the difference.

In a possible embodiment of the present disclosure, the processing circuit includes a first calculation module configured to determine the spatial depth of the virtual image to be displayed, determine a value of x using an equation $$\frac{p}{x} = \frac{L-s}{L},$$

determine a deflection angle $\alpha$ of the collimated light beam passing through each optical unit using an equation $\tan \alpha = (D-x)/2s$, and determine an inclination angle $\theta 1$ of the equivalent right angle prism corresponding to each optical unit using equations $\alpha = \theta_2 - \theta_1$ and $n \sin \theta_1 = \sin \theta_2$, where $L-s$ represents the spatial depth of the virtual image to be displayed, $L$ represents a distance between the virtual image to be displayed and one of the viewing points, $p$ represents a distance between the two adjacent optical units, $s$ represents a viewing distance between one of the viewing points and the display panel, $x$ represents a distance between the two viewing points where the light beams passing through the optical device are converged, $D$ represents a width of the optical device, $\theta 1$ represents the inclination angle of the equivalent right angle prism and it is equal to an incident angle of the collimated light beam relative to an oblique surface of the equivalent right angle prism, and $\theta 2$ represents a refraction angle of the collimated light beam passing through the equivalent right angle prism.

In a possible embodiment of the present disclosure, the processing circuit includes a second calculation module configured to: determine the difference between the refractive index of each portion of each optical unit and the refractive index of the portion with the minimum refractive index using equations $\Delta n_1 d = nh_1 - h_1$, $\Delta n_2 d = nh_2 - h_2$, ..., $\Delta n_{m-1} d = nh_{m-1} - h_{m-1}$, $\Delta n_m d = nh_{m-1} - h_m = 0$ and $h_1 = p \tan \theta_1$; divide each optical unit into m portions having a same length in a first direction from a center of the optical device to an edge of the optical device, the m portion sequentially comprising a first portion, a second portion, ..., and an $m^{th}$ portion, $\Delta n_j$ being a difference between a refractive index of a $j^{th}$ portion and the refractive index of the portion with the minimum refractive index; and divide a cross section of the equivalent right angle prism corresponding to the optical unit into m portions along a right angle side adjacent to the inclination angle of the equivalent right angle prism, the m portions sequentially comprising a first portion, a second portion, . . . , and an $m^{th}$ portion in a direction from a right angle to the inclination angle of the equivalent right angle prism, each portion having a height of hj, where j is an integer not greater than m and not small than 1, n represents a refractive index of the equivalent right angle prism corresponding to the optical unit, d represents a liquid crystal cell thickness, and p represents a transverse width of the equivalent right angle prism, i.e., a transverse width of the optical unit.

In a possible embodiment of the present disclosure, the driving circuit is further configured to drive the liquid crystal molecules in each portion of the optical unit to be deflected, so as to enable a difference between a refractive index of a $j^{th}$ portion and the refractive index of the portion with the minimum refractive index to be equal to $\Delta nj$.

In a possible embodiment of the present disclosure, an angle between an initial alignment direction of the liquid crystal molecules in the optical device and a polarization direction of the collimated light beam is smaller than 90°.

In a possible embodiment of the present disclosure, the initial alignment direction of the liquid crystal molecules in the optical device is the same as the polarization direction of the collimated light beam.

In a possible embodiment of the present disclosure, two optical devices are laminated at the light-exiting side of the display panel, and the initial alignment directions of the liquid crystal molecules in the two optical devices are perpendicular to each other.

In a possible embodiment of the present disclosure, the display panel is a Liquid Crystal Display (LCD) panel or an Organic Light-Emitting Diode (OLED) panel.

In another aspect, the present disclosure provides in some embodiments a display method for use in the above-mentioned display device, including a step of adjusting an angle of an light beam emitted from a display panel refracted by each optical unit, so as to enable collimated light beams from the adjacent optical units to have different emergent angles, thereby to converge the light beams emitted from the display panel at two viewing points and display a virtual image with a spatial depth.

In a possible embodiment of the present disclosure, the display method further includes: acquiring the spatial depth of the virtual image to be displayed by the display device, determining an inclination angle of an equivalent right angle prism corresponding to each optical unit based on the spatial depth of the virtual image, dividing each optical unit into m portions, determining a difference between a refractive index of each portion of the optical unit and a refractive index of a portion with a minimum refractive index based on the inclination angle of the equivalent right angle prism corresponding to the optical unit, and driving liquid crystal molecules in each portion of the optical unit to be deflected based on the difference, where m is an integer greater than 1.

In a possible embodiment of the present disclosure, the step of determining the inclination angle of the equivalent right angle prism corresponding to each optical unit based on the spatial depth of the virtual image includes: determining the spatial depth of the virtual image to be displayed, and determining a value of x using an equation $$\frac{p}{x} = \frac{L-s}{L};$$

determining a deflection angle $\alpha$ of the collimated light beam passing through each optical unit using an equation $\tan \alpha = (D-x)/2s$; and determining an inclination angle $\theta 1$ of the equivalent right angle prism corresponding to each optical unit using equations $\alpha = \theta_2 - \theta_1$ and $n \sin \theta_1 = \sin \theta_2$, where L−s represents the spatial depth of the virtual image to be displayed, L represents a distance between the virtual image to be displayed and one of the viewing points, p represents a distance between the two adjacent optical units, s represents a viewing distance between one of the viewing points and the display panel, x represents a distance between the two viewing points where the light beams passing through an optical device are converged, D represents a width of the optical device, $\theta 1$ represents the inclination angle of the equivalent right angle prism and it is equal to an incident angle of the collimated light beam relative to an oblique surface of the equivalent right angle prism, and $\theta 2$ represents a refraction angle of the collimated light beam passing through the equivalent right angle prism.

In a possible embodiment of the present disclosure, the step of dividing each optical unit into m portions and determining the difference between the refractive index of each portion of the optical unit and the refractive index of the portion with the minimum refractive index based on the inclination angle of the equivalent right angle prism corresponding to the optical unit includes: determining the difference between the refractive index of each portion of each optical unit and the refractive index of the portion with the minimum refractive index using equations $\Delta n_1 d = nh_1 - h_1$, $\Delta n_2 d = nh_2 - h_2$, . . . , $\Delta n_{m-1} d = nh_{m-1} - h_{m-1}$, $\Delta n_m d = nh_m - h_m = 0$ and $h_1 = p \tan \theta_1$; dividing each optical unit into m equal portions in a first direction from a center of the optical device to an edge of the optical device, the m equal portion sequentially including a first portion, a second portion, . . . , and an $m^{th}$ portion, $\Delta nj$ being a difference between a refractive index of a $j^{th}$ portion and the refractive index of the portion with the minimum refractive index; and dividing a cross section of the equivalent right angle prism corresponding to the optical unit into m portions along a right angle side adjacent to the inclination angle of the equivalent right angle prism, the m portions sequentially including a first portion, a second portion, . . . , and an $m^{th}$ portion in a direction from a right angle to the inclination angle of the equivalent right angle prism, each portion having a height of hj, where j is an integer not greater than m and not small than 1, n represents a refractive index of the equivalent right angle prism corresponding to the optical unit, d represents a liquid crystal cell thickness, and p represents a transverse width of the equivalent right angle prism, i.e., a transverse width of the optical unit.

In a possible embodiment of the present disclosure, the step of driving the liquid crystal molecules in each portion of the optical unit to be deflected based on the difference includes driving the liquid crystal molecules in each portion of the optical unit to be deflected, so as to enable a difference between a refractive index of a $j^{th}$ portion and the refractive index of the portion with the minimum refractive index to be equal to $\Delta nj$.

In yet another aspect, the present disclosure provides in some embodiments a near-to-eye display device, including: a display panel, configured to emit a light beam being linearly-polarized, collimated; and a plurality of optical devices arranged independently of each other and at a light-exiting side of the display panel. The optical units correspond to pixel units of the display panel in a one-to-one correspondence manner. Each optical unit is capable of refracting the light beam emitted from the display panel at an adjustable angle, so as to enable collimated light beams from the adjacent optical units to have different emergent angles, and display a virtual image with an adjustable spatial depth.

In a possible embodiment of the present disclosure, each optical unit includes a first electrode, a second electrode, and a liquid crystal unit arranged between the first electrode and the second electrode.

In a possible embodiment of the present disclosure, the neat-to-eye display device further includes a processing circuit and a driving circuit. The processing circuit is configured to acquire the spatial depth of the virtual image to be displayed by the display device, determine an inclination angle of an equivalent right angle prism corresponding to each optical unit based on the spatial depth of the virtual image, divide each optical unit into m portions, and determine a difference between a refractive index of each portion of the optical unit and a refractive index of a portion with a minimum refractive index based on the inclination angle of the equivalent right angle prism corresponding to the optical unit, where m is an integer greater than 1. The driving circuit is configured to drive liquid crystal molecules in each portion of the optical unit to be deflected based on the difference.

In still yet another aspect, the present disclosure provides in some embodiments a display method for use in the above-mentioned near-to-eye display device, including steps of: acquiring a spatial depth of a virtual image to be displayed, and determining an inclination angle of an equivalent right angle prism corresponding to each optical unit based on the spatial depth of the virtual image to be displayed; dividing each optical unit into m portions, and determining a difference between a refractive index of each portion of the optical unit and a refractive index of a portion with a minimum refractive index based on the inclination angle of the equivalent right angle prism corresponding to the optical unit; and driving liquid crystal molecules in each portion of the optical unit to be deflected based on the difference, so as to adjust an angle of an light beam emitted from a corresponding pixel unit refracted by each optical unit.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
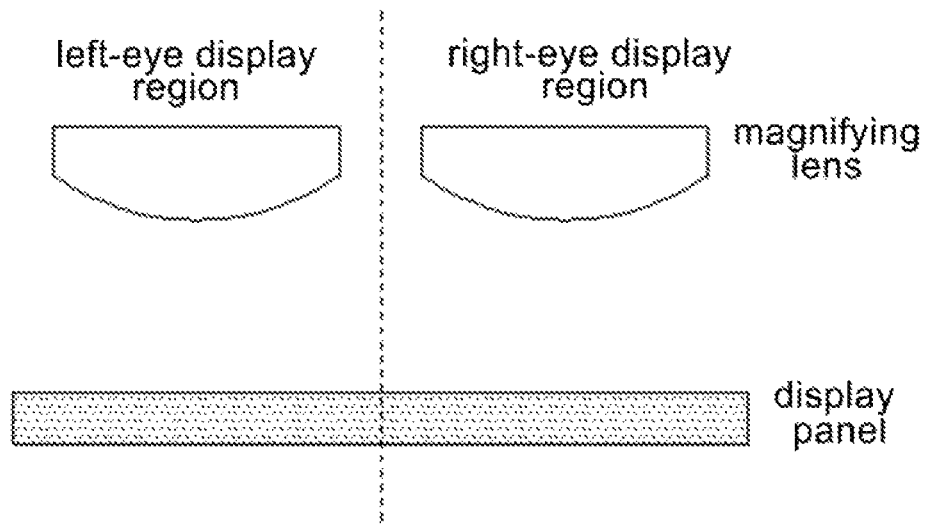
FIG. 1 is a schematic view showing a virtual display device in a related art.

As shown in FIG. 1, for a virtual display device in the related art, two positive lenses are arranged in front of a display panel in such a manner that a focal length of each positive lens is greater than a distance between the display panel and the positive lens. In this way, the positive lens functions as a magnifying lens capable of magnifying an image and enabling the image farther from a human eye. Hence, erected virtual images acquired at a near-to-eye position through the positive lenses may be combined in a brain, so as to produce a stereo image.

However, the two positive lenses are relatively thick and heavy. In addition, an optical aberration may occur due to the single lens, and thereby a feeling of discomfort may occur when the virtual display device is worn by a person or the image is displayed on the virtual display device. Further, the virtual image displayed on the virtual display device has a fixed spatial depth.

An object of the present disclosure is to provide a display device and a display method, so as to display a virtual image at a variable spatial depth.

The present disclosure provides in some embodiments a display device, including: a display panel, configured to emit a light beam being linearly-polarized, collimated; and at least one optical device arranged at a light-exiting side of the display panel. The optical device includes a plurality of optical units independent of each other and corresponding to pixel units of the display panel in a one-to-one correspondence manner. Each optical unit is capable of refracting the light beam emitted from the display panel at an adjustable angle. Collimated light beams from the adjacent optical units have different emergent angles so that the light beams emitted from the display panel are converged at two viewing points, so as to display a virtual image at a predetermined spatial depth.

According to the display device in the embodiments of the present disclosure, the display panel emits the light beam being linearly-polarized, collimated light beam. The optical device includes the plurality of optical units each capable of refracting the light beam emitted from the display panel at an adjustable angle, so the optical unit is equivalent to a right angle prism. The deflected collimated light beams are received by human eyes. The collimated light beams from the adjacent optical units have different emergent angles, so the light beams from the adjacent optical units may be directed to one eye at a certain field angle. In this way, it is able for the optical units to virtualize a display image and move the display image backward, thereby to enable one eye of a person to view the image in a near-to-eye manner. In addition, through the adjustment of a deflection angle of the collimated light beams, it is able to change the spatial depth of the virtual image, thereby to display the virtual image at a variable spatial depth.

In a possible embodiment of the present disclosure, the optical device includes: a first electrode and a second electrode arranged opposite to each other; and a liquid crystal cell arranged between the first electrode and the second electrode. The liquid crystal cell includes a plurality of liquid crystal cells independent of each other.

The first electrode and the second electrode are arranged on different transparent substrates respectively, or on an identical transparent substrate. The first electrode and the second electrode are powered to generate an electric field, so as to drive liquid crystal molecules in each liquid crystal unit to be deflected.

Each liquid crystal unit and the corresponding first electrode and second electrode may form the optical unit, and after the deflection of the liquid crystal molecules in each optical unit under the effect of the electric field, the optical unit may be equivalent to a right angle prism.

The display panel may be an LCD panel or an OLED panel. The light beams emitted from the display panel must be the collimated light beams, so in the LCD panel, a backlight source of the LCD panel is a collimated light source, and in the OLED panel, an additional member needs to be provided, so as to convert the light beams from the OLED panel into the collimated light beams toward the optical device.

In a possible embodiment of the present disclosure, in the display device, the liquid crystal molecules in the optical unit is driven to be deflected based on the spatial depth of the virtual image to be displayed. In a possible embodiment of the present disclosure, the display device further includes a processing circuit and a driving circuit.

The processing circuit is configured to acquire the spatial depth of the virtual image to be displayed by the display device, determine an inclination angle of the equivalent right angle prism corresponding to each optical unit based on the spatial depth of the virtual image, divide each optical unit into m portions, and determine a difference between a refractive index of each portion of the optical unit and a refractive index of a portion with a minimum refractive index based on the inclination angle of the equivalent right angle prism corresponding to the optical unit, where m is an integer greater than 1. The larger the value of m is, the better effect the collimated light beams are refracted by the optical unit, and the more difficult the implementation thereof is. Hence, the value of m may be determined based on the practical need. The driving circuit is configured to drive the liquid crystal molecules in each portion of the optical unit to be deflected based on the difference.

In a possible embodiment of the present disclosure, the processing circuit includes a first calculation module configured to determine the spatial depth of the virtual image to be displayed, determine a value of x using an equation $$\frac{p}{x} = \frac{L-s}{L},$$

determine a deflection angle $\alpha$ of the collimated light beam passing through each optical unit using an equation $\tan \alpha = (D-x)/2s$, and determine an inclination angle $\theta 1$ of the equivalent right angle prism corresponding to each optical unit using equations $\alpha = \theta_2 - \theta_1$ and $n \sin \theta_1 = \sin \theta_2$, where L−s represents the spatial depth of the virtual image to be displayed, L represents a distance between the virtual image to be displayed and one of the viewing points, p represents a distance between the two adjacent optical units, s represents a viewing distance between one of the viewing points and the display panel, x represents a distance between the two viewing points where the light beams passing through the optical device are converged, D represents a width of the optical device, $\theta 1$ represents the inclination angle of the equivalent right angle prism and it is equal to an incident angle of the collimated light beam relative to an oblique surface of the equivalent right angle prism, and $\theta 2$ represents a refraction angle of the collimated light beam passing through the equivalent right angle prism.

In a possible embodiment of the present disclosure, the processing circuit includes a second calculation module configured to: determine the difference between the refractive index of each portion of each optical unit and the refractive index of the portion with the minimum refractive index using equations $\Delta n_1 d = nh_1 - h_1$, $\Delta n_2 d = nh_2 - h_2$, ..., $\Delta n_{m-1} d = nh_{m-1} - h_{m-1}$, $\Delta n_m d = nh_m - h_m = 0$ and $h_1 = p \tan \theta_1$; divide each optical unit into m portions having the same length in a first direction from a center of the optical device to an edge of the optical device, the m portion sequentially including a first portion, a second portion, ..., and an $m^{th}$ portion; and divide a cross section of the equivalent right angle prism corresponding to the optical unit into m portions along a right angle side adjacent to the inclination angle of the equivalent right angle prism, the m portions sequentially including a first portion, a second portion, ..., and an $m^{th}$ portion in a direction from a right angle to the inclination angle of the equivalent right angle prism, each portion having a height of hj, where $\Delta$nj is a difference between a $j^{th}$ portion of the optical unit and an $m^{th}$ portion having a minimum refractive index, j is an integer not greater than m and not small than 1, n represents a refractive index of the equivalent right angle prism corresponding to the optical unit, d represents a liquid crystal cell thickness, and p represents a transverse width of the equivalent right angle prism, i.e., a transverse width of the optical unit.

In a possible embodiment of the present disclosure, the driving circuit is further configured to drive the liquid crystal molecules in each portion of the optical unit to be deflected, so as to enable a difference between a refractive index of a $j^{th}$ portion and the refractive index of the portion with the minimum refractive index to be equal to $\Delta$nj.

In a possible embodiment of the present disclosure, one optical device is arranged at the light-exiting side of the display panel. If an initial alignment direction of the liquid crystal molecules in the optical device is perpendicular to a polarization direction of the collimated light beam, it is impossible for the optical device to deflect the collimated light beam. Hence, a predetermined angle between the initial alignment direction of the liquid crystal molecules in the optical device and the polarization direction of the collimated light beam is smaller than 90°.

In a possible embodiment of the present disclosure, the initial alignment direction of the liquid crystal molecules in the optical device is identical to the polarization direction of the collimated light beam, so that the optical device is capable of refracting all the light beams emitted from the display panel.

In a possible embodiment of the present disclosure, two optical devices are laminated at a light-exiting side of the display panel, and the initial alignment directions of the liquid crystal molecules in the two optical devices are perpendicular to each other. In this way, regardless of the angle between the polarization direction of the light beam emitted from the display panel and the initial alignment direction of the liquid crystal molecules, it is able for the optical device to refract the light beams emitted from the display panel.

The present disclosure further provides in some embodiments a display method for use in the above-mentioned display device. The display method includes a step of adjusting an angle of a light beam emitted from a display panel refracted by each optical unit, so as to enable collimated light beams from the adjacent optical units to have different emergent angles, thereby to converge the light beams emitted from the display panel at two viewing points and display a virtual image at a preset spatial depth.

In a possible embodiment of the present disclosure, the display method further includes: acquiring the spatial depth of the virtual image to be displayed by the display device, determining an inclination angle of an equivalent right angle prism corresponding to each optical unit based on the spatial depth of the virtual image, dividing each optical unit into m portions, determining a difference between a refractive index of each portion of the optical unit and a refractive index of a portion with a minimum refractive index based on the inclination angle of the equivalent right angle prism corresponding to the optical unit, and driving liquid crystal molecules in each portion of the optical unit to be deflected based on the difference, where m is an integer greater than 1.

According to the display method in the embodiments of the present disclosure, the optical device is arranged at the light-exiting side of the display panel and includes the plurality of optical units each capable of refracting the light beam emitted from the display panel, so the optical unit is equivalent to a right angle prism. The deflected light beams are received by human eyes. The collimated light beams from the adjacent optical units have different emergent angles, so the light beams may be directed to each eye at a certain field angle. In this way, it is able for the optical units to virtualize a display image and move the display image backward, thereby to enable a person to view the image in a near-to-eye manner. In addition, through the adjustment of the deflection angle of the collimated light beams, it is able to change the spatial depth of the virtual image, thereby to display the virtual image at a variable spatial depth.

In a possible embodiment of the present disclosure, the step of determining the inclination angle of the equivalent right angle prism corresponding to each optical unit based on the spatial depth of the virtual image to be displayed includes: determining the spatial depth of the virtual image to be displayed, and determining a value of x using an equation $$\frac{p}{x} = \frac{L-s}{L};$$

determining a deflection angle $\alpha$ of the collimated light beam passing through each optical unit using an equation $\tan \alpha = (D-x)/2s$; and determining an inclination angle $\theta 1$ of the equivalent right angle prism corresponding to each optical unit using equations $\alpha = \theta_2 - \theta_1$ and $n \sin \theta_1 = \sin \theta_2$, where L-s represents the spatial depth of the virtual image to be displayed, L represents a distance between the virtual image to be displayed and one of the viewing points, p represents a distance between the two adjacent optical units, s represents a viewing distance between one of the viewing points and the display panel, x represents a distance between the two viewing points where the light beams passing through an optical device are converged, D represents a width of the optical device, $\theta 1$ represents the inclination angle of the equivalent right angle prism and it is equal to an incident angle of the collimated light beam relative to an oblique surface of the equivalent right angle prism, and $\theta 2$ represents a refraction angle of the collimated light beam passing through the equivalent right angle prism.

In a possible embodiment of the present disclosure, the step of dividing each optical unit into m portions and determining the difference between the refractive index of each portion of the optical unit and the refractive index of the portion with the minimum refractive index based on the inclination angle of the equivalent right angle prism corresponding to the optical unit includes: determining the difference between the refractive index of each portion of each optical unit and the refractive index of the portion with the minimum refractive index using equations $\Delta n_1 d = n h_1 - h_1$, $\Delta n_2 d = n h_2 - h_2$, ..., $\Delta n_{m-1} d = n h_{m-1} - h_{m-1}$, $\Delta n_m d = n h_m - h_m = 0$ and $h_1 = p \tan \theta_1$; dividing each optical unit into m portions having the same length in a first direction from a center of the optical device to an edge of the optical device, the m portion sequentially including a first portion, a second portion, ..., and an $m^{th}$ portion; and dividing a cross section of the equivalent right angle prism corresponding to the optical unit into m portions along a right angle side adjacent to the inclination angle of the equivalent right angle prism, the m portions sequentially including a first portion, a second portion, ..., and an $m^{th}$ portion in a direction from a right angle to the inclination angle of the equivalent right angle prism, each portion having a height of hj, where nj is a difference between a $j^{th}$ portion of the optical unit and an $m^{th}$ portion having a minimum refractive index, j is an integer not greater than m and not small than 1, n represents a refractive index of the equivalent right angle prism corresponding to the optical unit, d represents a liquid crystal cell thickness, and p represents a transverse width of the equivalent right angle prism, i.e., a transverse width of the optical unit.

In a possible embodiment of the present disclosure, the step of driving the liquid crystal molecules in each portion of the optical unit to be deflected based on the difference includes driving the liquid crystal molecules in each portion of the optical unit to be deflected, so as to enable a difference between a refractive index of a $j^{th}$ portion and the refractive index of the portion with the minimum refractive index to be equal to $\Delta nj$.

The display device will be described hereinafter in conjunction with the drawings.

Figure 2:
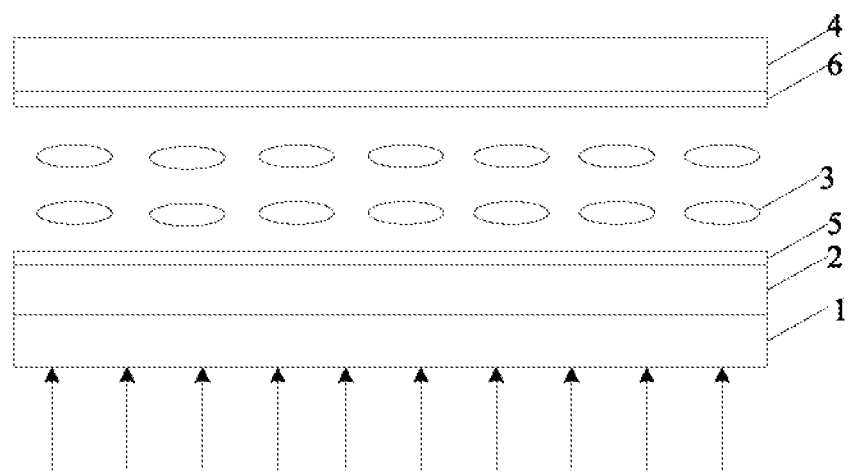
FIG. 2 is a schematic view showing an optical device according to at least one embodiment of the present disclosure.

As shown in FIG. 2 which shows the optical device according to one embodiment of the present disclosure, the optical device is capable of refracting the linearly-polarized, collimated light beams from a display panel 1, so as to direct the light beams to the human eyes accurately. The optical device includes, from bottom to top (as viewed in FIG. 2), a base substrate 2, a first electrode 5, a liquid crystal cell 3, a second electrode 6 and another base substrate 4. The display panel 1 may be an LCD panel or an OLED panel, and the light beams entering the optical device need to be the linearly-polarized, collimated light beams.

The first electrode 5 is arranged on an upper surface of the base substrate 2, and the second electrode 6 is arranged on a lower surface of the other base substrate 4. Both the first electrode 5 and the second electrode 6 are transparent electrodes. The first electrode 5 is a strip-like electrode and the second electrode 6 is a plate-like electrode, or the first electrode 5 is a plate-like electrode and the second electrode 6 is a strip-like electrode, as long as the first electrode 5 and the second electrode 6 are powered to generate an electrical field to drive the liquid crystal molecules in the liquid crystal layer to be deflected.

In a possible embodiment of the present disclosure, the initial alignment direction of the liquid crystal molecules in the liquid crystal layer 3 is parallel to the polarization direction of the collimated light beams from the display panel 1. FIG. 2 merely shows a situation where the initial alignment direction of the liquid crystal molecules and the polarization direction of the light beams from the display panel 1 are both parallel to a paper surface.

When the linearly-polarized, collimated light beams pass through liquid crystals, different deflection states of the liquid crystal molecules correspond to different refractive indices. If a long-axis direction of the liquid crystal is parallel to the polarization direction of the light beam, the refractive index of the light beam in the liquid crystal cell is ne, and if the long-axis direction of the liquid crystal is perpendicular to the polarization direction of the light beam, the refractive index of the light beam in the liquid crystal cell is no, where ne>no. The light beam may pass through the liquid crystal cell at any refractive index between ne and no. Depending on this feature, it is able to make an optical path difference between two adjacent light beams passing through the liquid crystal cell equal to an optical path difference between the light beams passing through a right angle prism, thereby to enable the liquid crystal cell to modulate a geometric direction of the light beam in a manner similar to the right angle prism. At this time, the liquid crystal cell is equivalent to a right angle prism array, and an inclination angle of the right angle prism may be adjusted dynamically by changing the electric field between the first electrode and the second electrode.

The relationship between the equivalent right angle prism and the liquid crystal cell will be described hereinafter when the polarization direction is parallel to the paper surface. Of course, it may also be applied to the linearly-polarized light beam in any other polarization direction, as long as the initial alignment direction of the liquid crystal molecules is parallel to the polarization direction of the light beams.

Figure 3:
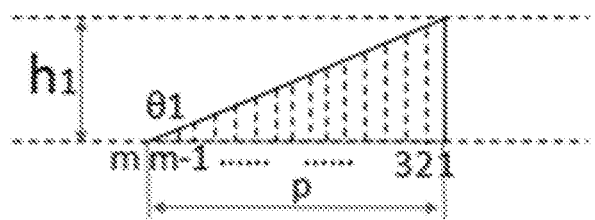
FIG. 3 is a schematic view showing an equivalent right angle prism of an optical unit according to at least one embodiment of the present disclosure.
Figure 4:
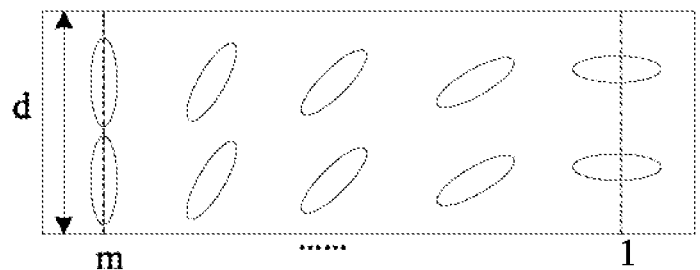
FIG. 4 is a schematic view showing the optical unit divided into m portions according to at least one embodiment of the present disclosure.

As shown in FIGS. 3 and 4, the equivalent right angle prism of the liquid crystal cell is divided into m portions, and the liquid crystal cell is also divided into m portions. Based on the principle where the optical path difference is the same, the following equations may be acquired: $\Delta n_1 d = nh_1 - h_1$, $\Delta n_2 d = nh_2 - h_2$, . . . , $\Delta n_{m-1} d = nh_{m-1} - h_{m-1}$, $\Delta n_m d = nh_m - h_m = 0$ and $h_1 = p \tan \theta_1$, where n represents a refractive index of the equivalent right angle prism, hm represents a thickness of an $m^{th}$ portion of the equivalent right angle prism, d represents a liquid crystal cell thickness, $\Delta n1$ represents a difference between a refractive index of a first portion and a refractive index of an $m^{th}$ portion of the liquid crystal cell, $\theta 1$ represents an inclination angle of the equivalent right angle prism, and p represents a transverse width of the equivalent right angle prism.

Based on the above equations, different inclination angles $\theta 1$ of the right angle prism may correspond to different thicknesses h1, and thereby correspond to different optical path differences And of the liquid crystal cell. To be specific, a value of the inclination angle $\theta 1$ of the right angle prism may be selected based on the requirement on a refraction direction of the light beam.

Figure 5:
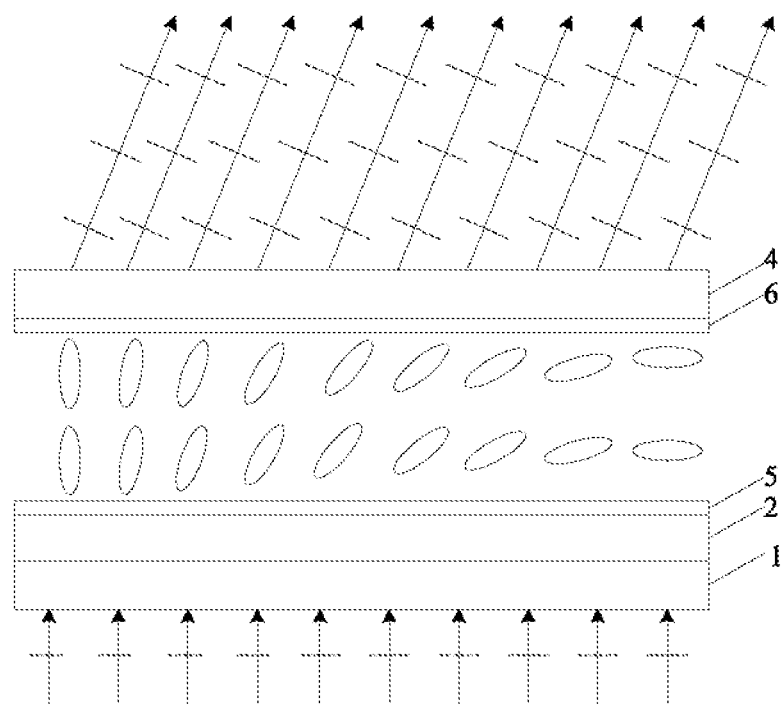
FIG. 5 is a schematic view showing a situation where a linearly-polarized, collimated light beam is emitted to and refracted by the optical unit according to at least one embodiment of the present disclosure.

FIG. 5 shows an emitting direction of the linearly-polarized, collimated light beam from the display panel 1 after passing through one optical unit.

Figure 6:
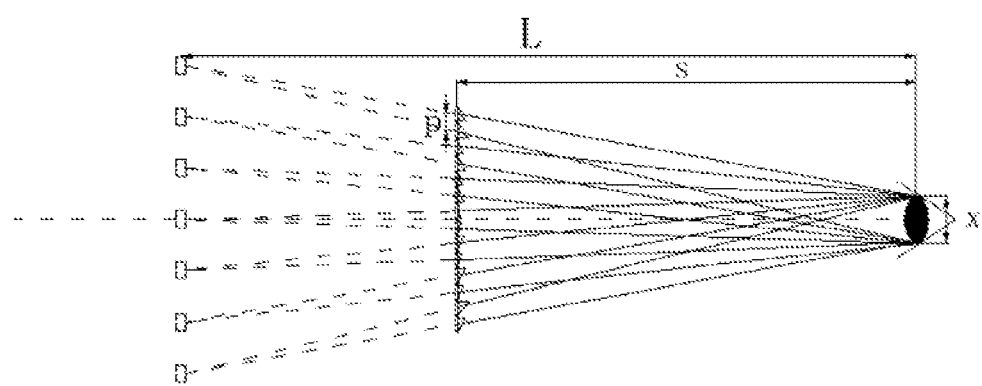
FIG. 6 is a schematic view showing the formation of a virtual image through the optical device according to at least one embodiment of the present disclosure.

As shown in FIG. 5, for a correspondence between the display panel 1 and the optical device, one pixel of the display panel corresponds to one optical unit, different pixels correspond to different optical units, and different optical units are equivalent to the right angle prisms with different inclination angles. In addition, as shown in FIG. 6, the inclination angles of the right angle prisms equivalent to the optical units are distributed symmetrically as a whole. The light beams from the display panel are converged at two viewing points and received by one eye of a person, so that the light beams from the adjacent two or more pixels are directed to the eye at a certain field angle. In this way, it is able to display a virtual image through the cooperation of two or more pixels, and move the virtual image backward, thereby to enable the person to view the virtual image by one eye at a near position.

In FIG. 6, depending on a geometric relationship, it is able to acquire the following equation, $$\frac{p}{x} = \frac{L-s}{L}, \text{ i.e., } L = \frac{s}{1 - \frac{p}{x}},$$

where s represents a viewing distance between the human eye and the display panel, L represents a distance between the virtual image and the human eye, p represents a distance between the two pixels (or a distance between the two optical units), and x represents a distance between different positions where the light beams from the two pixels reach the human eyes (usually equal to an interpupillary distance).

Based on the above equation, the distance between the virtual image and the human eye is related to x. The smaller the value of x is, the larger the value of L is. Hence, it is able to acquire different values of x through adjusting the inclination angle of the equivalent right angle prism of each optical unit, thereby to display the virtual image at any spatial depth. However, along with an increase in the value of L, a distance between the two pixels may increase too, resulting in a reduced pixel density of the virtual image. Hence, it is necessary to display the virtual image at an appropriate spatial depth acquired after all situations are taken into consideration.

Figure 7:
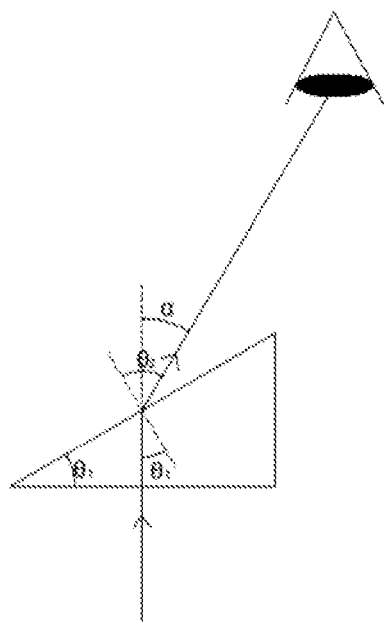
FIG. 7 is a schematic view showing a situation where a light beam is refracted by a right angle prism.

For different pixels, a desired deflection angle of the light beam entering the human eye may be designed at first, and then the inclination angle of the equivalent right angle prism corresponding to each pixel may be calculated based on a refraction law. As shown in FIG. 7, for a cross section of the right angle prism, a represents the refraction angle of the collimated light beam, $\theta 1$ represents the inclination angle of the equivalent right angle prism, i.e., an incident angle of the collimated light beam relative to an oblique surface of the equivalent right angle prism, and $\theta 2$ represents the reflection angle. The following equations may be acquired: $\alpha = \theta_2 - \theta_1$ and $n \sin \theta_1 = \sin \theta_2$.

If the deflection angle $\alpha$ is already known, it is able to calculate the inclination angle $\theta 1$ of the right angle prism. When displaying the virtual image, the display device needs to determine the spatial depth of the virtual image to be displayed at first, determine the value of x using the equation $$\frac{p}{x} = \frac{L-s}{L},$$

determine the deflection angle α of the collimated light beam passing through each optical unit using the equation tan α=(D−x)/2s, and determine the inclination angle θ1 of the equivalent right angle prism corresponding to each optical unit using the equations α=$\theta_2$−$\theta_1$ and n sin $\theta_1$=sin $\theta_2$ where D represents a width of the optical device. The liquid crystal molecules in the corresponding optical unit may be driven to be deflected based on the determined inclination angle θ1 of the equivalent right angle prism, and at this time, the optical unit is equivalent to the right angle prism with the inclination angle θ1.

Figure 8:
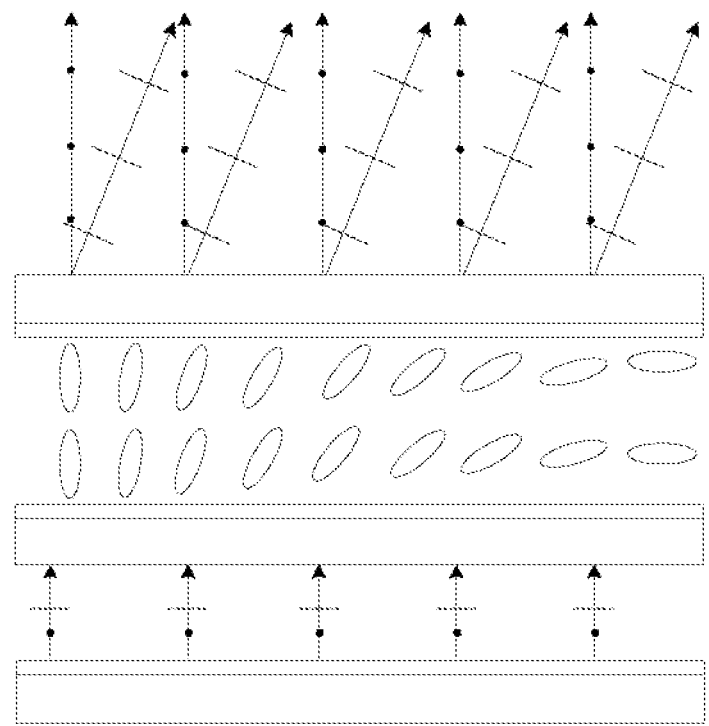
FIG. 8 is a schematic view showing the arrangement of one optical device at a light-exiting side of a display panel according to at least one embodiment of the present disclosure.
Figure 9:
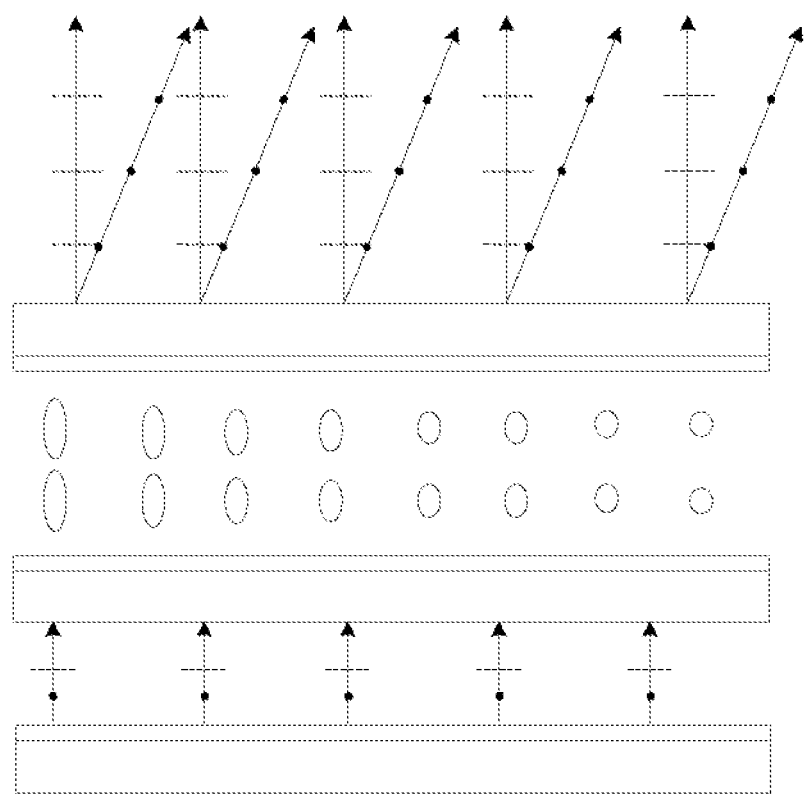
FIG. 9 is another schematic view showing the arrangement of one optical device at the light-exiting side of the display panel according to at least one embodiment of the present disclosure.

As shown in FIGS. 8 and 9, in the case that merely on optical device is arranged at the light-exiting side of the display panel and the initial alignment direction of the liquid crystal molecules in the optical device is perpendicular to the polarization direction of the collimated light beams, it is impossible for the optical device to deflect the collimated light beams. Hence, the initial alignment direction of the liquid crystal molecules in the optical device needs to be angled relative to the polarization direction of the collimated light beams at a predetermined angle of smaller than 90°.

As shown in FIG. 8, the initial alignment direction of the liquid crystal molecules is parallel to the paper surface, so under the effect of the electric field generated between the electrodes, it is merely able for the liquid crystal cell to deflect the polarized light beams parallel to the paper surface, rather than to deflect the polarized light beams perpendicular to the paper surface.

As shown in FIG. 9, the initial alignment direction of the liquid crystal molecules is perpendicular to the paper surface, so under the effect of the electric field generated between the electrodes, it is merely able for the liquid crystal cell to deflect the polarized light beams perpendicular to the paper surface, rather than to deflect the polarized light beams parallel to the paper surface.

Figure 10:
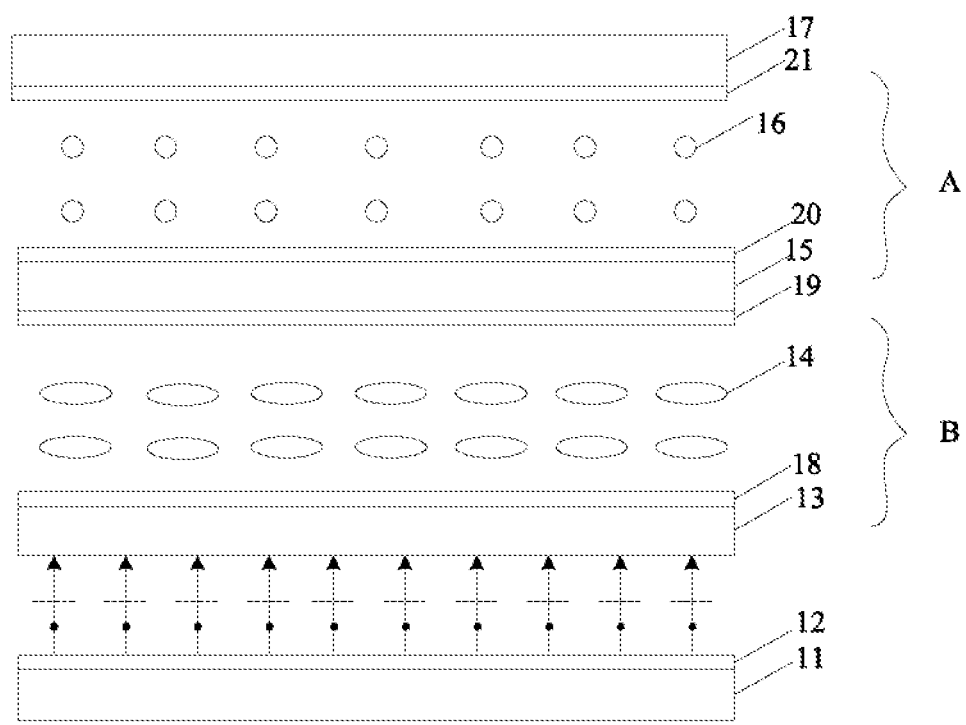
FIG. 10 is a schematic view showing the arrangement of two optical devices in a laminated manner at the light-exiting side of the display panel according to at least one embodiment of the present disclosure.
Figure 11:
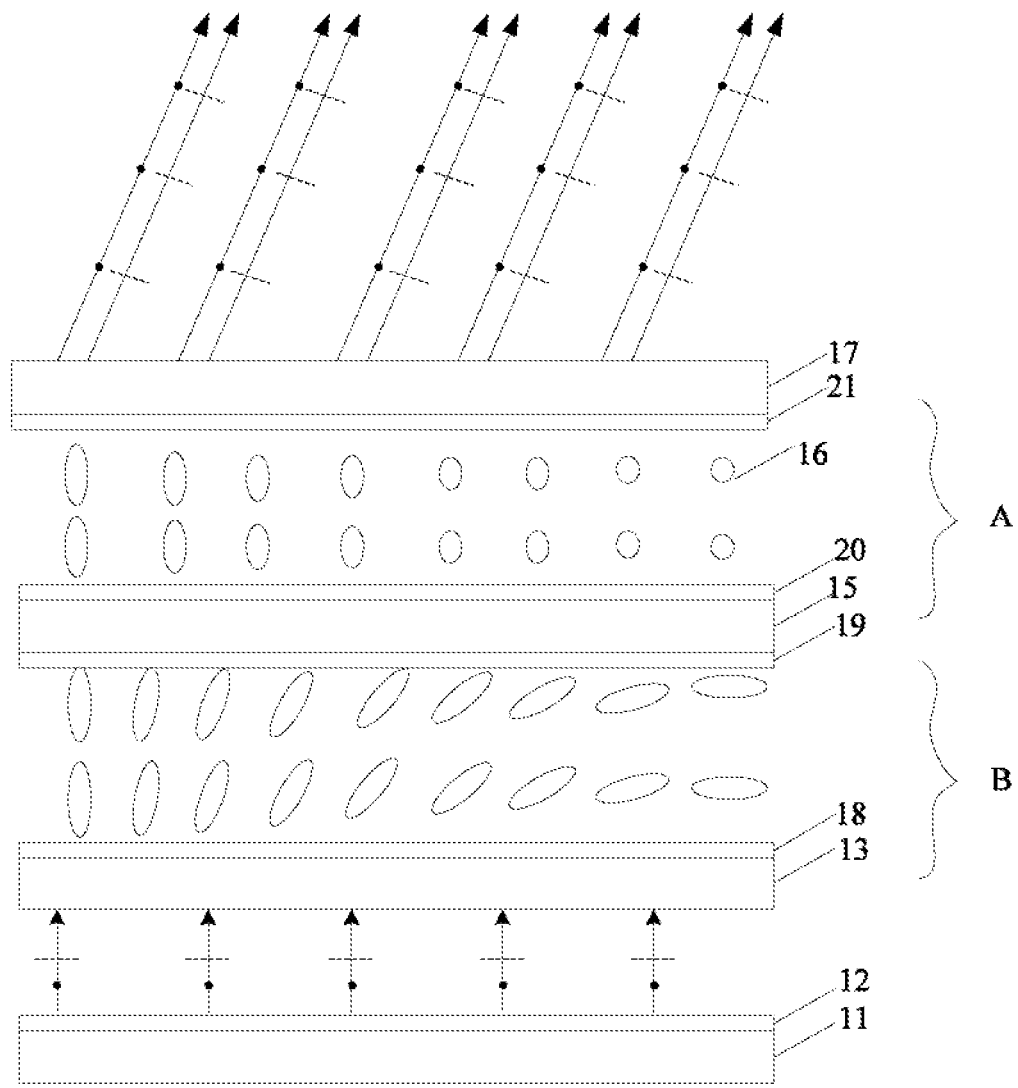
FIG. 11 is another schematic view showing the arrangement of two optical devices in a laminated manner at the light-exiting side of the display panel according to at least one embodiment of the present disclosure.

In order not to limit the polarization direction of the light beams from the display panel, as shown in FIGS. 10 and 11, two optical devices A and B may be laminated at the light-exiting side of the display panel, and the initial alignment directions of the liquid crystal molecules in the two optical devices are perpendicular to each other. In this way, regardless of the angle between the polarization direction of the light beams from the display panel and the initial alignment direction of the liquid crystal molecules, it is able for the optical devices to deflect the light beam from the display panel. The optical devices A and B may share an identical base substrate 15. In a light travelling direction, the optical devices A and B sequentially include a base substrate 13, an electrode 18, a liquid crystal layer 14, an electrode 19, the base substrate 15, an electrode 20, a liquid crystal layer 16, an electrode 21 and a base substrate 17. An initial alignment direction of liquid crystal molecules in the liquid crystal layer 14 is perpendicular to an initial alignment direction of liquid crystal molecules in the liquid crystal layer 16.

As shown in FIGS. 10 and 11, the collimated light beam from the display panel 11 passes through a polarizer 12 and is converted into the linearly-polarized, collimated light beam. A polarization state of the resultant linearly-polarized, collimated light beam may be orthogonally decomposed into a vector parallel to the initial alignment direction of the liquid crystals in the liquid crystal layer 14 and a vector parallel to the initial alignment direction of the liquid crystals in the liquid crystal layer 16. When that the electrodes are powered, it is able for each of the two liquid crystal cells to deflect the polarized light beam parallel to the initial alignment direction of the liquid crystal molecules therein. When the two liquid crystal cells are arranged in a laminated manner, it is able for them to deflect the collimated light beams in any polarization directions.

When the two optical devices are laminated at the light-exiting side of the display panel, one pixel of the display panel corresponds to a pair of optical units laminated one on another, different pixels correspond to different pairs of optical units, different optical units are equivalent to the right angle prism with different inclination angles, and the inclination angles of the equivalent right angle prisms are distributed symmetrically as a whole. In this way, the light beams from the adjacent two or more pixels are directed to the eye at a certain field angle, so it is able to display the virtual image through the cooperation of two or more pixels, and move the virtual image backward, thereby to enable the person to view the virtual image with one eye at a near position.

According to the embodiments of the present disclosure, an optical device is arranged at the light-exiting side of the display panel. The optical device includes the plurality of optical units each capable of refracting the light beam emitted from the display panel, so the optical unit is equivalent to a right angle prism. The deflected light beams are received by the human eyes. The collimated light beams from the adjacent optical units have different emergent angles, so the light beams may be directed to each eye at a certain field angle. In this way, it is able for the optical units to virtualize the display image and move the display image backward, thereby to enable the person to view the image in a near-to-eye manner. In addition, through the adjustment of the deflection angle of the collimated light beams, it is able to change the spatial depth of the virtual image, thereby to display the virtual image at any spatial depth.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display device, comprising:
   a display panel, configured to emit a light beam being linearly-polarized, collimated; and
   at least one optical device arranged at a light-exiting side of the display panel,
   wherein the optical device comprises a plurality of optical units independent of each other and corresponding to pixel units of the display panel in a one-to-one correspondence manner, each optical unit is capable of refracting the light beam emitted from the display panel at an adjustable angle, and collimated light beams from adjacent optical units have different emergent angles so that the light beams emitted from the display panel are converged at two viewing points, so as to display a virtual image with a spatial depth,
   wherein the optical device comprises a first electrode and a second electrode arranged opposite to each other; and a liquid crystal cell arranged between the first electrode and the second electrode,
   wherein the liquid crystal cell comprises a plurality of liquid crystal units independent of each other, the first electrode and the second electrode are arranged on different transparent substrates respectively, or on a same transparent substrate, the first electrode and the second electrode are powered to generate an electric field to drive liquid crystal molecules in each liquid crystal unit to be deflected, and each liquid crystal unit and the first electrode and second electrode that correspond to the liquid crystal unit form the optical unit, and the liquid crystal molecules in each optical unit are driven to be deflected by the electric field, the optical unit is equivalent to a right angle prism, wherein the display device further comprises a processing circuit and a driving circuit, wherein the processing circuit is configured to acquire the spatial depth of the virtual image to be displayed by the display device, and determine an inclination angle of the equivalent right angle prism corresponding to each optical unit based on the spatial depth of the virtual image, divide each optical unit into m portions, and determine a difference between a refractive index of each portion of the optical unit and a refractive index of a portion with a minimum refractive index based on the inclination angle of the equivalent right angle prism corresponding to the optical unit, where m is an integer greater than 1; and the driving circuit is configured to drive the liquid crystal molecules in each portion of the optical unit to be deflected based on the difference, wherein the processing circuit comprises a first calculation module configured to determine the spatial depth of the virtual image to be displayed, determine a value of x using an equation $$\frac{p}{x} = \frac{L-s}{L},$$

determine a deflection angle $\alpha$ of the collimated light beam passing through each optical unit using an equation $\tan \alpha = (D-x)/2s$, and determine an inclination angle $\theta_1$ of the equivalent right angle prism corresponding to each optical unit using equations $\alpha = \theta_2 - \theta_1$ and $n \sin \theta_1 = \sin \theta_2$, wherein L−s represents the spatial depth of the virtual image to be displayed, L represents a distance between the virtual image to be displayed and one of the viewing points, p represents a distance between two adjacent optical units, s represents a viewing distance between one of the viewing points and the display panel, x represents a distance between the two viewing points wherein the light beams passing through the optical device are converged, D represents a width of the optical device, $\theta_1$ represents the inclination angle of the equivalent right angle prism and it is equal to an incident angle of the collimated light beam relative to an oblique surface of the equivalent right angle prism, and $\theta_2$ represents a refraction angle of the collimated light beam passing through the equivalent right angle prism.

2. The display device according to claim 1, wherein the processing circuit comprises a second calculation module configured to: determine the difference between refractive index of each portion of each optical unit and the refractive index of the portion with the minimum refractive index using equations $\Delta n_1 d = nh_1 - h_1$, $\Delta n_2 d = nh_2 - h_2$, ..., $\Delta n_{m-1} d = nh_{m-1} - h_{m-1}$, $\Delta n_m d = nh_m - h_m = 0$ and $h_1 = p \tan \theta_1$; divide each optical unit into m portions having a same length in a first direction from a center of the optical device to an edge of the optical device, the m portions sequentially comprising a first portion, a second portion, ..., and an $m^{th}$ portion, $\Delta n_j$ being a difference between a refractive index of a $j^{th}$ portion and the refractive index of the portion with the minimum refractive index; and divide a cross section of the equivalent right angle prism corresponding to the optical unit into m portions along a right angle side adjacent to the inclination angle of the equivalent right angle prism, the m portions sequentially comprising a first portion, a second portion, ..., and an $m^{th}$ portion in a direction from a right angle to the inclination angle of the equivalent right angle prism, each portion having a height of hj, where j is an integer not greater than m and not small than 1, n represents a refractive index of the equivalent right angle prism corresponding to the optical unit, d represents a liquid crystal cell thickness, and p represents a transverse width of an equivalent right angle prism, that is a transverse width of the optical unit.

3. The display device according to claim 2, wherein the driving circuit is further configured to drive the liquid crystal molecules in each portion of the optical unit to be deflected, to enable a difference between a refractive index of a $j^{th}$ portion and the refractive index of the portion with the minimum refractive index to be equal to $\Delta n_j$.

4. The display device according to claim 1, wherein an angle between an initial alignment direction of the liquid crystal molecules in the optical device and a polarization direction of the collimated light beam is smaller than 90°.

5. The display device according to claim 4, wherein the initial alignment direction of the liquid crystal molecules in the optical device is the same as the polarization direction of the collimated light beam.

6. The display device according to claim 1, wherein two optical devices are laminated at the light-exiting side of the display panel, and initial alignment directions of the liquid crystal molecules in the two optical devices are perpendicular to each other.

7. The display device according to claim 1, wherein the display panel is a Liquid Crystal Display (LCD) panel or an Organic Light-Emitting Diode (OLED) panel.

8. A display method for use in the display device according to claim 1, comprising:

adjusting an angle of a light beam emitted from a display panel refracted by each optical unit, to enable collimated light beams from the adjacent optical units to have different emergent angles, thereby to converge the light beams emitted from the display panel at two viewing points and display a virtual image with a spatial depth;

acquiring the spatial depth of the virtual image to be displayed by the display device, determining an inclination angle of an equivalent right angle prism corresponding to each optical unit based on the spatial depth of the virtual image, dividing each optical unit into m portions, determining a difference between a refractive index of each portion of the optical unit and a refractive index of a portion with a minimum refractive index based on the inclination angle of the equivalent right angle prism corresponding to the optical unit, and driving liquid crystal molecules in each portion of the optical unit to be deflected based on the difference, where m is an integer greater than 1, wherein the step of determining the inclination angle of the equivalent right angle prism corresponding to each optical unit based on the spatial depth of the virtual image comprises:

determining the spatial depth of the virtual image to be displayed, and determining a value of x using an equation $$\frac{p}{x} = \frac{L-s}{L};$$

determining a deflection angle α of the collimated light beam passing through each optical unit using an equation tan α=(D−x)/2s; and determining an inclination angle θ1 of the equivalent right angle prism corresponding to each optical unit using equations α=θ$_2$−θ$_1$ and n sin θ$_1$=sin θ$_2$, where L−s represents the spatial depth of the virtual image to be displayed, L represents a distance between the virtual image to be displayed and one of the viewing points, p represents a distance between two adjacent optical units, s represents a viewing distance between one of the viewing points and the display panel, x represents a distance between the two viewing points where the light beams passing through an optical device are converged, D represents a width of the optical device, θ1 represents the inclination angle of the equivalent right angle prism and it is equal to an incident angle of the collimated light beam relative to an oblique surface of the equivalent right angle prism, and θ2 represents a refraction angle of the collimated light beam passing through the equivalent right angle prism.

9. The display method according to claim 8, wherein the step of dividing each optical unit into m portions and determining the difference between the refractive index of each portion of the optical unit and the refractive index of the portion with the minimum refractive index based on the inclination angle of the equivalent right angle prism corresponding to the optical unit comprises:

determining the difference between refractive index of each portion of each optical unit and the refractive index of the portion with the minimum refractive index using equations Δn$_1$d=nh$_1$−h$_1$, Δn$_2$d=nh$_2$−h$_2$, . . . , Δn$_{m-1}$d=nh$_{m-1}$−h$_{m-1}$, Δn$_m$d=nh$_m$−h$_m$=0 and h$_1$=p tan θ$_1$;

dividing each optical unit into m portions having a same length in a first direction from a center of the optical device to an edge of the optical device, the m portions sequentially comprising a first portion, a second portion, . . . , and an m$^{th}$ portion, Δnj being a difference between a refractive index of a j$^{th}$ portion and the refractive index of the portion with the minimum refractive index; and dividing a cross section of the equivalent right angle prism corresponding to the optical unit into m portions along a right angle side adjacent to the inclination angle of the equivalent right angle prism, the m portions sequentially comprising a first portion, a second portion, . . . , and an m$^{th}$ portion in a direction from a right angle to the inclination angle of the equivalent right angle prism, each portion having a height of hj, where j is an integer not greater than m and not small than 1, n represents a refractive index of the equivalent right angle prism corresponding to the optical unit, d represents a liquid crystal cell thickness, and p represents a transverse width of the equivalent right angle prism, that is a transverse width of the optical unit.

10. The display method according to claim 9, wherein the step of driving the liquid crystal molecules in each portion of the optical unit to be deflected based on the difference comprises driving the liquid crystal molecules in each portion of the optical unit to be deflected, to enable a difference between a refractive index of a j$^{th}$ portion and the refractive index of the portion with the minimum refractive index to be equal to Δnj.

11. A near-to-eye display device, comprising:
a display panel, configured to emit a light beam being linearly-polarized, collimated; and
a plurality of optical devices arranged independently of each other and at a light-exiting side of the display panel,
wherein the optical devices correspond to pixel units of the display panel in a one-to-one correspondence manner, each optical unit is capable of refracting the light beam emitted from the display panel at an adjustable angle, so as to enable collimated light beams from adjacent optical units to have different emergent angles, and display a virtual image with an adjustable spatial depth,
wherein each optical unit comprises a first electrode; a second electrode; and a liquid crystal unit arranged between the first electrode and the second electrode,
wherein the near-to-eye display device further comprises a processing circuit and a driving circuit,
wherein the processing circuit is configured to acquire the spatial depth of the virtual image to be displayed by the display device, determine an inclination angle of an equivalent right angle prism corresponding to each optical unit based on the spatial depth of the virtual image, divide each optical unit into m portions, and determine a difference between a refractive index of each portion of the optical unit and a refractive index of a portion with a minimum refractive index based on the inclination angle of the equivalent right angle prism corresponding to the optical unit, where m is an integer greater than 1, and
the driving circuit is configured to drive liquid crystal molecules in each portion of the optical unit to be deflected based on the difference,
wherein the processing circuit comprises a first calculation module configured to determine the spatial depth of the virtual image to be displayed, determine a value of x using an equation $$\frac{p}{x} = \frac{L-s}{L},$$

determine a deflection angle α of the collimated light beam passing through each optical unit using an equation tan α=(D−x)/2s, and determine an inclination angle θ1 of the equivalent right angle prism corresponding to each optical unit using equations α=θ$_2$−θ$_1$ and n sin θ$_1$=sin θ$_2$, wherein L−s represents the spatial depth of the virtual image to be displayed, L represents a distance between the virtual image to be displayed and one of the viewing points, p represents a distance between two adjacent optical units, s represents a viewing distance between one of the viewing points and the display panel, x represents a distance between the two viewing points wherein the light beams passing through the optical device are converged, D represents a width of the optical device, θ1 represents the inclination angle of the equivalent right angle prism and it is equal to an incident angle of the collimated light beam relative to an oblique surface of the equivalent right angle prism, and θ2 represents a refraction angle of the collimated light beam passing through the equivalent right angle prism.

12. A display method for use in the near-to-eye display device according to claim 11, comprising steps of:
- acquiring a spatial depth of a virtual image to be displayed, and determining an inclination angle of an equivalent right angle prism corresponding to each optical unit based on the spatial depth of the virtual image to be displayed;
- dividing each optical unit into m portions, and determining a difference between a refractive index of each portion of the optical unit and a refractive index of a portion with a minimum refractive index based on the inclination angle of the equivalent right angle prism corresponding to the optical unit; and
- driving liquid crystal molecules in each portion of the optical unit to be deflected based on the difference, so as to adjust an angle of an emergent light beam from a corresponding pixel unit refracted by each optical unit.

13. A display method for use in a display device comprising:
- a display panel, configured to emit a light beam being linearly-polarized, collimated; and
- at least one optical device arranged at a light-exiting side of the display panel,
- wherein the optical device comprises a plurality of optical units independent of each other and corresponding to pixel units of the display panel in a one-to-one correspondence manner, each optical unit is capable of refracting the light beam emitted from the display panel at an adjustable angle, and collimated light beams from adjacent optical units have different emergent angles so that the light beams emitted from the display panel are converged at two viewing points, so as to display a virtual image with a spatial depth,
- wherein the optical device comprises a first electrode and a second electrode arranged opposite to each other; and a liquid crystal cell arranged between the first electrode and the second electrode,
- wherein the liquid crystal cell comprises a plurality of liquid crystal units independent of each other, the first electrode and the second electrode are arranged on different transparent substrates respectively, or on a same transparent substrate, the first electrode and the second electrode are powered to generate an electric field to drive liquid crystal molecules in each liquid crystal unit to be deflected, and each liquid crystal unit and the first electrode and second electrode that correspond to the liquid crystal unit form the optical unit, and the liquid crystal molecules in each optical unit are driven to be deflected by the electric field, the optical unit is equivalent to a right angle prism,
- wherein the display device further comprises a processing circuit and a driving circuit,
- wherein the processing circuit is configured to acquire the spatial depth of the virtual image to be displayed by the display device, and determine an inclination angle of the equivalent right angle prism corresponding to each optical unit based on the spatial depth of the virtual image, divide each optical unit into m portions, and determine a difference between a refractive index of each portion of the optical unit and a refractive index of a portion with a minimum refractive index based on the inclination angle of the equivalent right angle prism corresponding to the optical unit, where m is an integer greater than 1; and
- the driving circuit is configured to drive the liquid crystal molecules in each portion of the optical unit to be deflected based on the difference, the method comprising:
- adjusting the angle of the light beam emitted from the display panel refracted by each optical unit, to enable the collimated light beams from the adjacent optical units to have different emergent angles, thereby to converge the light beams emitted from the display panel at two viewing points and display the virtual image with the spatial depth;
- acquiring the spatial depth of the virtual image to be displayed by the display device, determining the inclination angle of the equivalent right angle prism corresponding to each optical unit based on the spatial depth of the virtual image, dividing each optical unit into m portions, determining the difference between the refractive index of each portion of the optical unit and the refractive index of the portion with the minimum refractive index based on the inclination angle of the equivalent right angle prism corresponding to the optical unit, and driving liquid crystal molecules in each portion of the optical unit to be deflected based on the difference,
- wherein the step of determining the inclination angle of the equivalent right angle prism corresponding to each optical unit based on the spatial depth of the virtual image comprises:
- determining the spatial depth of the virtual image to be displayed, and determining a value of x using an equation $$\frac{p}{x} = \frac{L-s}{L};$$

- determining a deflection angle $\alpha$ of the collimated light beam passing through each optical unit using an equation $\tan \alpha = (D-x)/2s$; and
- determining an inclination angle $\theta_1$ of the equivalent right angle prism corresponding to each optical unit using equations $\alpha = \theta_2 - \theta_1$ and $n \sin \theta_1 = \sin \theta_2$,
- where L−s represents the spatial depth of the virtual image to be displayed, L represents a distance between the virtual image to be displayed and one of the viewing points, p represents a distance between two adjacent optical units, s represents a viewing distance between one of the viewing points and the display panel, x represents a distance between the two viewing points where the light beams passing through an optical device are converged, D represents a width of the optical device, $\theta_1$ represents the inclination angle of the equivalent right angle prism and it is equal to an incident angle of the collimated light beam relative to an oblique surface of the equivalent right angle prism, and $\theta_2$ represents a refraction angle of the collimated light beam passing through the equivalent right angle prism.

* * * * *